(12) United States Patent
Hartmann (10) Patent No.: US 7,382,669 B2
(45) Date of Patent: Jun. 3, 2008

(54) SEMICONDUCTOR MEMORY COMPONENT AND METHOD FOR TESTING SEMICONDUCTOR MEMORY COMPONENTS

(75) Inventor: Udo Hartmann, Neuried (DE)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 11/376,447

(22) Filed: Mar. 15, 2006

(65) Prior Publication Data

US 2006/0250864 A1 Nov. 9, 2006

(30) Foreign Application Priority Data

Mar. 15, 2005 (DE) .................. 10 2005 011 893

(51) Int. Cl.
*G11C 7/00* (2006.01)
(52) U.S. Cl. .................. 365/201; 365/200; 714/718
(58) Field of Classification Search .................. 365/201, 365/200; 714/718
See application file for complete search history.

(56) References Cited

U.S. PATENT DOCUMENTS 5,668,763 A 9/1997 Fujioka et al.
5,841,957 A 11/1998 Ju et al.
5,946,245 A * 8/1999 Brown et al. .............. 365/201
6,546,503 B2 4/2003 Ooishi
6,810,492 B2 10/2004 Weber et al.

FOREIGN PATENT DOCUMENTS

DE 199 51 534 5/2000

* cited by examiner

*Primary Examiner*—Anh Phung
*Assistant Examiner*—Nam Nguyen
(74) *Attorney, Agent, or Firm*—Dicke, Billig & Czaja, PLLC (57) ABSTRACT

A semiconductor component and method of testing a semiconductor component is disclosed. The invention relates to the parallel testing of semiconductor memory components having a fully functional memory area, which are classified as all good memory, and of semiconductor memory components having a restricted memory area, which are classified as partial good memory. For testing semiconductor memory components classified as partial good memory, the result, independently of the result of the comparison for those test addresses which are assigned to a memory area outside the functional memory area of the semiconductor memory component classified as partial good memory, is overwritten with an error free signal and a semiconductor memory component classified as all good memory is simulated. The testing of semiconductor memory components classified as partial good memory is accelerated and simplified.

21 Claims, 5 Drawing Sheets

SEMICONDUCTOR MEMORY COMPONENT AND METHOD FOR TESTING SEMICONDUCTOR MEMORY COMPONENTS

CROSS-REFERENCE TO RELATED APPLICATION

This Utility patent application claims priority to German Patent Application No. DE 10 2005 011 893.3, filed on Mar. 15, 2005, which is incorporated herein by reference.

FIELD OF THE INVENTION

The present invention relates to a semiconductor memory component and method for testing semiconductor memory components having a restricted memory area (partial good memories).

BACKGROUND OF THE INVENTION

A known semiconductor memory component is described in the patent specification U.S. Pat. No. 6,546,503.

Commercially conventional semiconductor memory components such as SRAMs, DRAMs and MRAMs are manufactured with regard to the address space and the extent of the smallest addressable memory unit, the data word width. A 512 Mbit DRAM in 32 Mbit×16 organization comprises an address space of $2^{25}$ bits or 32 Mbits, data words having a length of 16 data bits being addressed in each case. The DRAM then has 16 I/O data line connections and also $2^{25}$ individually selectable addressing lines. In the simplest case, the addressing lines are selected by means of two binary address decoders each having 13 inputs. The two address decoders are driven via an internal address bus having 13 internal address lines and are loaded successively from an address register. The address register is connected to 13 external address connections of the DRAM via which in each case two address words each having 13 address bits are read successively into the address register.

The semiconductor memory components are provided with surplus, redundant memory cells. Functional memory cells are activated or nonfunctional memory cells are deactivated depending on the result of a functional test of the memory cells, so that an error-free memory cell array of the respectively manufactured size is produced given sufficient resources.

If the functional memory area includes the area which can be completely addressed and evaluated by means of the internal addressing and data lines, then the respective semiconductor memory component is fully functional. The semiconductor memory component is consequently classified as "all good memory" and sorted and treated further as such.

If the redundancy provided in the semiconductor memory component does not suffice to classify a fully functional memory cell array in the above sense, then the respective semiconductor memory component can be configured as such with a restricted memory area. The functional memory area of such a semiconductor memory component is smaller than would be available, that is to say addressable and evaluatable, by means of the internal addressing lines or data lines. A semiconductor memory component having a functional memory area which is smaller than could be made available by means of the addressing lines and data lines is generally classified as "partial good memory" and is consequently sorted and treated further as such.

In the case of a 512 Mbit DRAM classified as a "half good memory," only half of the memory area available in accordance with the design is functional and either half of the data lines or one of the individual registers of one of the address decoders do not function. Such a half good memory differs from a 256 Mbit DRAM of the same technology which is classified as all good memory by virtue of the total number of memory cells.

A 512 Mbit DRAM downgraded to a half good memory (downgraded DRAM) can functionally replace a 256 Mbit DRAM given corresponding wiring of the address and data line connections.

U.S. Pat. No. 6,810,492 describes memory modules on which in each case a plurality of partial good RDRAMs simulate and replace one or a plurality of fully functional RDRAMs.

U.S. Pat. No. 5,841,957 describes a programmable decoding device for connection of semiconductor memory components having a restricted I/O data area, which are classified as partial good memory, to a standard memory bus.

U.S. Pat. No. 5,668,763 relates to an internal circuit supplementation for DRAMs for increasing the yield of semiconductor memory components which can in each case be classified as partial good memory.

Components classified as partial good memory are used in a multiplicity of applications for which, for instance, the dimensions or the full functionality of the semiconductor memory component are insignificant.

There are obtainable, as partial good memories, half good memories having half the memory capacity of a structurally identical all good memory, "quarter good memories" and "three-quarter good memories" having a quarter and three quarters, respectively, of the original memory area and also audio DRAMs (ADRAMs) for audio applications.

Partial good memories are already identified as such on the unseparated wafer and are subject to the same test cycles as all good memories.

Figure 1:
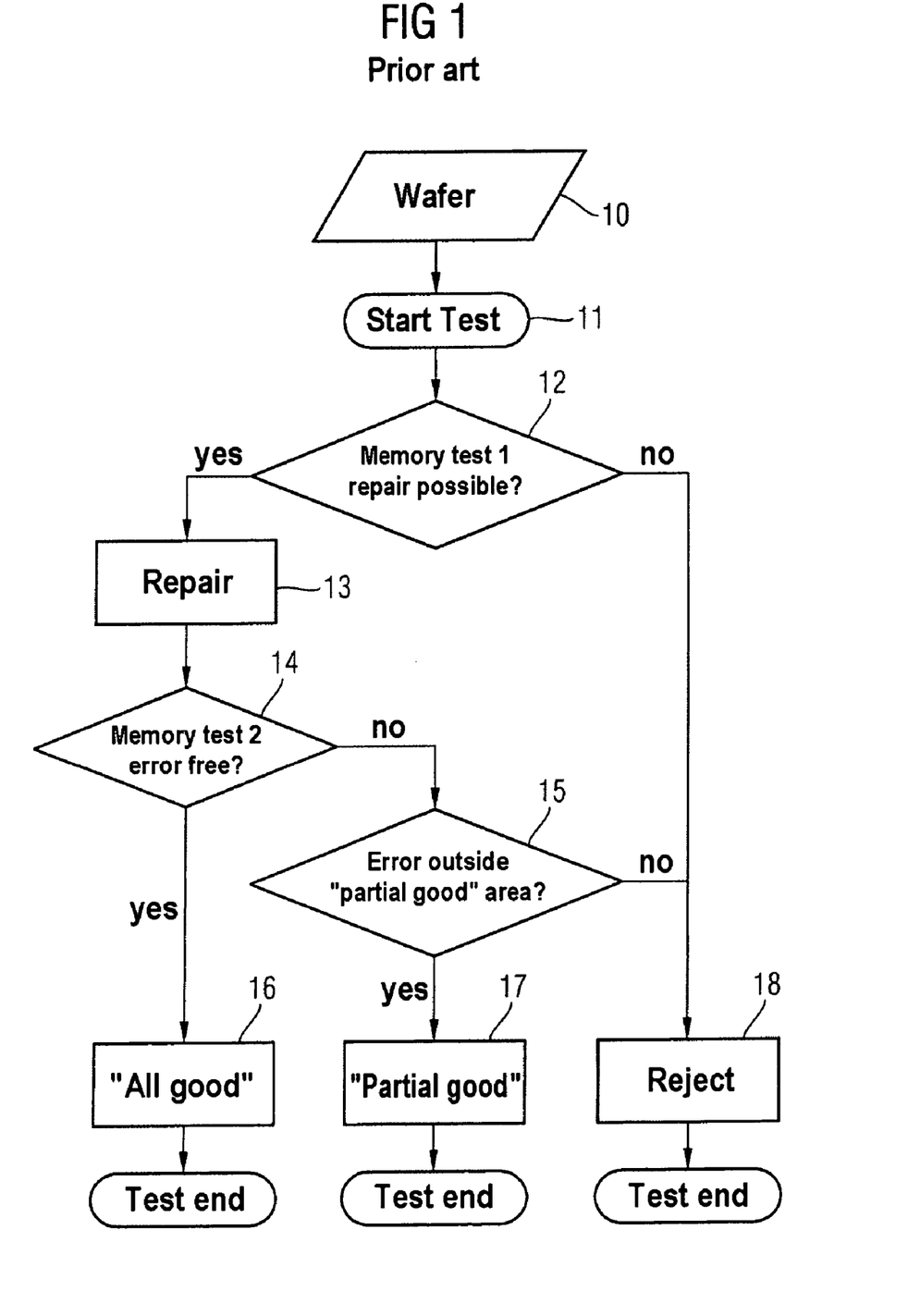
FIG. 1 illustrates a simplified flow diagram for the testing of semiconductor wafers having semiconductor memory components that are to be classified as all good memory and having semiconductor memory components that are to be classified as partial good memory, in accordance with the prior art.

The test cycle for a wafer having semiconductor memory components is illustrated in simplified fashion as a flow diagram in FIG. 1.

A wafer 10 having a multiplicity of semiconductor memory components of identical type, for instance DRAMs, is supplied to a test apparatus for testing the semiconductor memory components. After the beginning of the test 11, defective memory cells are determined in a first memory test 12 (prefuse memory test). It is apparent from the number and localization of the defective memory cells whether a sufficient, at least partial repair of the respective semiconductor memory component is possible. In the course of a repair 13, a functional memory area is in each case configured by blowing fuses in suitable data and addressing lines within the memory cell array and the semiconductor memory component is classified as all good memory or partial good memory. The functional memory area, for the case of an all good memory, corresponds to the maximum available memory area predefined by the internal construction and, for the case of a partial good memory, is a memory area restricted in extent compared with the functional memory area of an all good memory.

The repair 13 is followed by a second memory test 14 (postfuse memory test) on the same or a different test apparatus. During the postfuse memory test, a distinction is initially not made between all good memory and partial good memories. Each semiconductor memory component on the wafer is subjected to the same memory test.

Accordingly, the result of the postfuse memory test 14 is final initially only for the semiconductor memory components classified as all good memories 16 for which no error was ascertained in the entire nominal memory area during the second memory test 14. For semiconductor memory components classified as partial good memory, it is necessary to ascertain, in the course of an evaluation 15, whether the memory cell arrays ascertained during the postfuse memory test 14 were found within the functional memory cell area of the partial good memory or outside the functional memory area of the partial good memory.

The postfuse memory test 14 is carried out in a manner similar to the prefuse memory test 12. A linking of the result of the prefuse memory test 12 with regard to the configuration of the functional memory area of partial good memories with the sequence of the postfuse memory test 14 proves to be not very practicable in the test station for mass production. In order to simplify the sequences in the test station, preferably firstly all of the semiconductor memory components on the same wafer are subjected to the same postfuse memory test 14. In the course of the postfuse memory test 14, a generally compressed pass/fail information item is written to an error data memory (fail memory) of the test apparatus simultaneously for a multiplicity of semiconductor memory components.

Afterward, for semiconductor memory components classified as partial good memory, the error data memory is checked to the effect of whether the defective memory cells identified in the postfuse memory test 14 are within or outside the functional memory area of the partial good memory. If the errors identified are assigned only to the uncoupled, functionless memory area outside the functional memory area, then the respective semiconductor memory component is error free in the context of the classification or sorting as partial good memory.

Usually, on the basis of the prefuse sorting for the semiconductor memory components that are respectively tested in parallel, the error data memories of the test apparatus are partially overwritten successively in the course of the evaluation, an error free information item being entered into the error data memory in each case for the respective nonfunctional memory areas of the semiconductor memory components classified as partial good memory.

If an error is ascertained within the memory area of the partial good memory which is expected to be functional after the repair, then the respective semiconductor memory component is defective.

Such a subsequent evaluation of the defective memory areas of partial good memories is time-consuming. If, on the other hand, the postfuse memory test is dispensed with in order to save time, then all the semiconductor memory components on the semiconductor wafer are rated or classified with lower quality, since a high-quality rating or classification presupposes a test of the memory cells after repair.

Furthermore, higher costs arise since, after the repair, semiconductor memory components that are still defective are initially built up into complete, marketable memory components in a complicated manner before they fail in the final test and are rejected.

For these and other reasons, there is a need for the present invention.

SUMMARY

The present invention provides a semiconductor memory component and method for testing semiconductor memory components having a restricted memory area.

In one embodiment, the present invention relates to the parallel testing of semiconductor memory components having a fully functional memory area, which are classified as all good memory, and of semiconductor memory components having a restricted memory area, which are classified as partial good memory. In order to test the semiconductor memory components, test data words are written to the memory cell array and, in parallel therewith, to a test write register. The data written to the memory cell array are compared bit by bit with the data stored in the test write register. An error free signal is generated in the case of matching. For semiconductor memory components classified as partial good memory, the result, independently of the result of the comparison for those test addresses which are assigned to a memory area outside the functional memory area of the semiconductor memory component classified as partial good memory, is overwritten with an error free signal and a semiconductor memory component classified as all good memory is simulated. The testing of semiconductor memory components classified as partial good memory is accelerated and simplified.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described.

Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention relates to a semiconductor memory component having a memory cell array having data word groups each having a desired number of memory cells, data lines, which are connected to a respective one of the memory cells of the data word groups and are suitable for transmitting data bits stored in the memory cells, a plurality of internal address lines, it being possible for a desired address space in the memory cell array to be addressed by means of the internal address lines, a test write register for buffer-storing a primary test data word read into the memory cell array at a test address outside the memory cell array, and comparator units for comparing mutually corresponding data bits of the respective primary test data word and of a secondary test data word read out from the memory cell array from the test address, in which case, when mutually corresponding data bits in the primary and secondary test data words match, an error free signal is generated in each case on PF signal lines respectively assigned to one of the comparator units. The invention furthermore relates to a method for testing semiconductor wafers having semiconductor memory components having memory cell arrays that are functional to different extents. The invention furthermore relates to a method for testing semiconductor wafers having semiconductor memory components having memory cell arrays that are functional to different extents.

The present invention provides semiconductor memory components whose testing in the postfuse memory test does not require any additional outlay both in the case of a classification as all good memory and in the case of a classification as partial good memory, without restriction of the test severity. The present invention also provides a method for testing semiconductor wafers that have both semiconductor memory components classified as all good memories and semiconductor memory components classified as partial good memories.

According to one embodiment of the invention, the semiconductor memory components are supplemented by a circuit by means of which a functional component classified as all good memory is simulated outside a functional memory area of a semiconductor memory component classified as partial good memory. For this purpose, the result of the testing of memory cells which are localized outside the functional memory area of the semiconductor memory component classified as partial good memory is overwritten with the information "error-free", or "pass", independently of the actual result. A semiconductor memory component classified as all good memory is simulated toward the outside, with respect to a test apparatus.

The invention relates to a semiconductor memory component having a memory cell array, in which a multiplicity of data word groups each having a desired number of memory cells can be selected individually in each case. For the addressing of the data word groups, the semiconductor memory component has addressing lines which are in each case connected to the memory cells of precisely one data word group and are suitable for the selective selection of a respective data word group. Data bits which are stored in the memory cells are transmitted into and from the memory cell array via data lines which are in each case assigned to precisely one of the memory cells of the data word groups.

In the memory cell array, a desired address space or desired address range can be addressed by means of a plurality of internal address lines. Usually, two half address words of a binary coded address are transmitted successively on external address lines. The internal address lines relate to a complete binary address word. In this case, the internal address bus may also be present merely in the form of input register stages of two address decoders. By way of example, an address space of $2^n$ data word groups can then be selected by means of n internal address lines.

The data lines are assigned a test write register for buffer-storing a primary test data word that is to be read into the memory cell array at a respective test address. Comparator units for comparing the primary test data word with a secondary test data word read out from the memory cell array from the test address are provided according to the number of data lines. When mutually corresponding data bits of the two test data words match, the respective comparator unit outputs an error free signal on a PF signal line. When mutually corresponding data bits of the two test data words do not match, the respective comparator unit outputs an error signal on the corresponding PF signal line.

According to one embodiment of the invention, provision is additionally made of an error address memory and also an address comparator, which is connected to the error address memory and the internal address lines and the output signal of which is coupled onto the PF signal lines.

One or a plurality of error addresses identifying a nonfunctional memory area within the desired address space are stored in nonvolatile fashion in the error address memory.

In the address comparator, the respective test address is compared with the error address or the error addresses. If the test address is an address within the nonfunctional memory area, then the output signal of the address comparator constrains an error free signal on the PF signal lines.

The memory cells assigned to the irreparable, or nonfunctional memory area of the semiconductor memory component classified as partial good memory appear to be error free from the standpoint of an external test apparatus. No error address is stored for semiconductor memory components classified as all good memory, so that these are furthermore completely tested.

A complete postfuse memory test is advantageously produced both for semiconductor memory components classified as all good memory and for semiconductor memory components classified as partial good memory. For the postfuse memory test, no information about the prefuse sorting is required at the test apparatus. All the semiconductor memory components are classified with high quality in the same way. The number of failures of completely built-up semiconductor memory components is reduced. The test time of semiconductor memory components classified as partial good memory in the postfuse memory test is reduced and corresponds to that of the semiconductor memory components classified as all good memory.

Semiconductor memory components generally have internal test logic arrangements that support the test of the semiconductor memory component at a test apparatus. A test logic usually comprises a data generator which is connected to the data lines and generates test data for testing the memory cell array. Furthermore, a test logic typically comprises an address generator, in the simpler case an address counter, for generating test addresses for testing the memory cell array. The data generator and also the address counter are controlled by a control unit of the test logic. In a test mode of the semiconductor memory component, the control unit controls a test sequence. In the course of the test sequence, test data are generated by the data generator, progressively written to the complete memory cell array and subsequently read out. Furthermore, a customary test logic comprises an evaluation unit for comparing the data written to the memory cell array with the read-out data.

In one embodiment, the comparator units are already part of the evaluation units of the test logic. The primary test data words are generated in the data generator. The test addresses at which the test data words are stored are generated by the address generator of the test logic. Recourse is advantageously had to resources already present in customary semiconductor memory components. In the simplest case, the realization of the semiconductor memory component according to the invention requires merely the additional implementation of the error address memory and of the address comparator and the connection thereof to the evaluation units of the internal test logic.

In one embodiment, the semiconductor memory component has a compression unit, which combines the error information output via the PF signal lines on a number of compression signal lines that is less than the number of PF signal lines. A larger number of semiconductor memory components can then advantageously be tested simultaneously at the test apparatus since a smaller number of test pins is required per semiconductor memory component.

In a further embodiment, each comparator unit is additionally assigned a programmable or erasable I/O skip unit. The I/O skip units are in each case erased if the respective data line is identified as not being functional in a prefuse sorting. An erased I/O skip unit constrains an error free signal on the respective PF signal line independently of the result of the comparison of the relevant data bits. The I/O skip units accordingly constrain, during the testing of the semiconductor memory component for those PF signal lines which are assigned to a nonfunctional memory area—defined by nonfunctional data lines—of a semiconductor memory component classified as partial good memory, an error free signal which is independent of the test address and the assignment thereof to a nonfunctional memory area defined by nonfunctional address lines.

Through the combination of I/O-related and address-related masking out of nonfunctional memory areas or through suitable selection of one mechanism or the other, it is possible to significantly increase the yield of semiconductor memory components that can be classified as partial good memory.

In one embodiment, the semiconductor memory component has a classification memory element, in which a classification identifier for distinguishing between semiconductor memory components classified as all good memory and semiconductor memory components classified as partial good memory is stored in nonvolatile fashion. The classification identifier is set for instance in the course of the repair of the semiconductor memory component if only a partial area of the desired address space is functional. On the basis of the classification identifier, the classification level of the semiconductor memory component is fixedly linked with the semiconductor memory component and can be read out in an automated manner externally at any time.

In a further embodiment, the address comparator is connected to the classification memory element and at least one output signal of the address comparator can be activated by the latter. The testing of semiconductor memory components classified as all good memory is then advantageously independent of those circuit parts in the semiconductor memory component which are supplemented for the test of semiconductor memory components classified as partial good memory.

In a further advantageous manner, the I/O skip units are connected to the classification identifier and can be activated by the latter. The testing of semiconductor memory components classified as all good memory is then advantageously independent of further circuit parts in the semiconductor memory component which are supplemented for the test of semiconductor memory components classified as partial good memory.

The semiconductor memory component according to the invention enables a new and advantageous method for testing semiconductor wafers having semiconductor memory components classified as all good memory and having semiconductor memory components classified as partial good memory. In this case, the semiconductor memory components each comprise a memory cell array, which has a desired address space predefined by a desired number of addressing lines and a desired I/O area predefined by a desired number of I/O data lines. In the case of semiconductor memory components classified as all good memory, the memory cell arrays are in each case functional over the entire desired I/O area and the entire desired address space. In the case of semiconductor memory components classified as partial good memory, only a partial area of the desired address space and/or a partial area of the desired I/O area is functional.

In one embodiment, the method includes a first functional testing of the memory areas of the semiconductor memory components (prefuse memory test). Nonfunctional sections of the memory area are replaced by activating redundant memory cells. Irreparable memory areas within the desired address range are marked by programming an error address by means of which the irreparable and consequently nonfunctional memory area of the semiconductor memory component—which can then be qualified as partial good memory—can be identified. In the course of a second functional testing of the semiconductor memory components (postfuse memory test), in each case the entire desired address space is addressed and the entire desired I/O area is evaluated. On the basis of the stored error address, an error-free behavior of the irreparable or nonfunctional memory area is simulated, so that both fully functional semiconductor memory components classified as all good memory and semiconductor memory components with restricted functionality that are classified as partial good memory are tested in the same way. The outputting of memory errors which are assigned to nonfunctional sections of the desired address range of semiconductor memory components with restricted functionality is suppressed.

In one embodiment, the method utilizes the functionality of an internal test logic of the respective semiconductor memory components. For this purpose, at least for the postfuse memory test, the test data words and the test addresses are generated in the internal test logic. The test data words are on the one hand buffer-stored in a test write register of the test logic and on the other hand are written to the memory cell array at the respective test address. The test data words are then read out from the memory cell array from the respective test address and compared with the test data words buffer-stored in the test write register. An error free signal is generated when the buffer-stored test data words and the read-out test data words match. By contrast, an error signal is generated when there is no match.

In one embodiment, a further nonfunctional memory area related to the desired I/O area is defined in addition to the nonfunctional memory area related to the desired address space. For this purpose, I/O skip units which are assigned in each case to a data line assigned to the further irreparable memory area are programmed in semiconductor memory components having a restricted memory area.

In the postfuse memory test, the programmed I/O skip units constrain error free signals on the respectively assigned PF signal lines, so that an error-free behavior of the data lines assigned to the further nonfunctional memory area is simulated.

Figure 2:
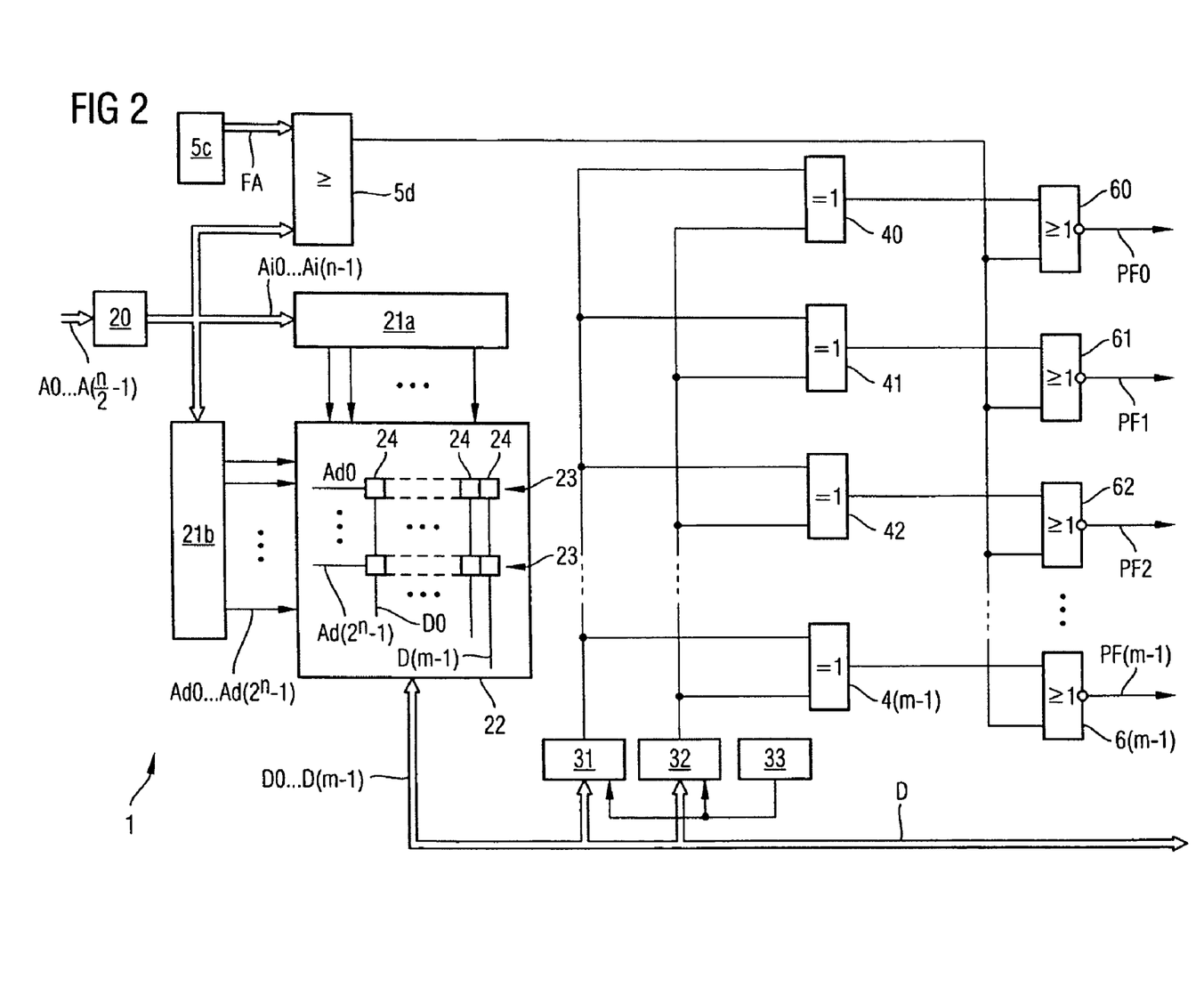
FIG. 2 illustrates a simplified block diagram of a detail from a semiconductor memory component with the relevant circuit parts in accordance with a first exemplary embodiment of the invention.

FIG. 2 illustrates a semiconductor memory component in accordance with a first simplified exemplary embodiment of the invention.

The semiconductor memory component 1 includes a memory cell array 22 having a multiplicity of memory cells 24. The memory cells 24 in the memory cell array 22 are organized into data word groups 23 which can in each case be selected individually by means of one of the addressing lines A0 to $A(2^n-1)$. The addressing lines A0 to $A(2^n-1)$ are selected by means of an address decoder 21 from a binary coded address that is passed to the address decoder 21a, 21b via internal address lines Ai0 to Ai(n-1). The address decoder 21a, 21b usually comprises in each case a column decoder 21a and a row decoder 21b.

The column decoder 21a and the row decoder 21b each have n individual registers and are loaded via the internal address lines Ai0 to Ai(n-1) successively according to two address words that are loaded into an address register 20 via external address lines A0 to A(n-1). The number of addressing lines A0 to $A(2^n-1)$ prescribes the maximum available desired address space of the semiconductor memory component.

Each memory cell 24 of a data word group 23 is connected to a data line D0, . . . D(m-1). The number m of data lines D0 . . . D(m-1) led to the memory cell array 22 defines a desired I/O area of the semiconductor memory component 1.

The memory cell array is usually organized in the form of a plurality of memory banks, the illustration of which is dispensed with for the purpose of simplification.

The data bus D composed of the data lines D0, . . . D(m-1) is led toward the outside via register and driver devices (not illustrated).

The data bus D is led to a test read register 31 and also to a test write register 32 for storing in each case a data word having m data bits. In parallel with a write access to the respective test address in the memory cell array 22, a test data word having m data bits in each case is written to the test write register 32 and buffer-stored.

The data word subsequently read back from the memory cell array 24 from the test address is buffer-stored in the test read register 31. A controller 33 controls the reading into and reading from the two registers 31, 32. The content of the two registers 31, 32 is compared bit by bit in comparator units 40, 41, . . . . The outputs of the comparator units 40, 41, . . . are connected, in each case together with the output of an address comparator 5d, to the inputs of a respective NOR gate 60, 61, . . . .

The signals on the PF signal lines PF0, PF1, . . . are coupled onto the data bus D for further evaluation in a customary manner outside the illustrated section and are transmitted to a test apparatus via the data bus D.

An error address FA identifying a nonfunctional memory area within the desired address range is stored in nonvolatile fashion in an error address memory 5c. In the address comparator 5d, one or more address bits of the error address FA are compared with the corresponding address bits in the two address words that are transmitted successively on the internal address lines Ai0 to Ai(n-1).

In the event of a match, that is to say in the event of an addressing of a nonfunctional memory area determined by the error address FA, an error free signal is constrained at the output of the NOR gates 60, 61, . . . on the PF signal lines PF0, PF1, . . . independently of the output signals of the comparator units 40, 41, . . . and independently of the content of the two registers 31, 32.

The error address memory 5c and also the address comparator 5d are specified only in a roughly schematic manner in each case in order to elucidate the invention. The way in which the error address FA is stored in the error address memory 5c and also the manner of the address comparison in the address comparator 5d are actually dependent on the final classification of the respective partial good memory and also the position of the nonfunctional memory area within the desired address space.

For a semiconductor memory component classified as half good memory, the nonfunctional memory area is assigned, in the simplest case, to precisely one address bit of the two address words, in which case both a set address bit and a non-set address bit can address the nonfunctional memory area. Each of the 2n address bits can be used for determining the nonfunctional memory area.

In alternative configurations in which the defective memory area cannot be assigned to precisely one address bit, the nonfunctional memory area of a semiconductor memory component classified as half good memory will be defined for instance by two pairs or four triplets of address bits. By way of example, the defective memory areas are described by A0, A1=0 and A0, A1=1, while the address ranges A0=0, A1=1 and A0=1, A1=0 are functional.

At least two address bits are evaluated for semiconductor memory components that can be classified as three quarter good memory. In that case, by way of example, only the address range A0 and A1=0 is nonfunctional, while for semiconductor memory components that can be classified as quarter good memories, A0 and A1=0 can actually specify the functional memory area.

Figure 3:
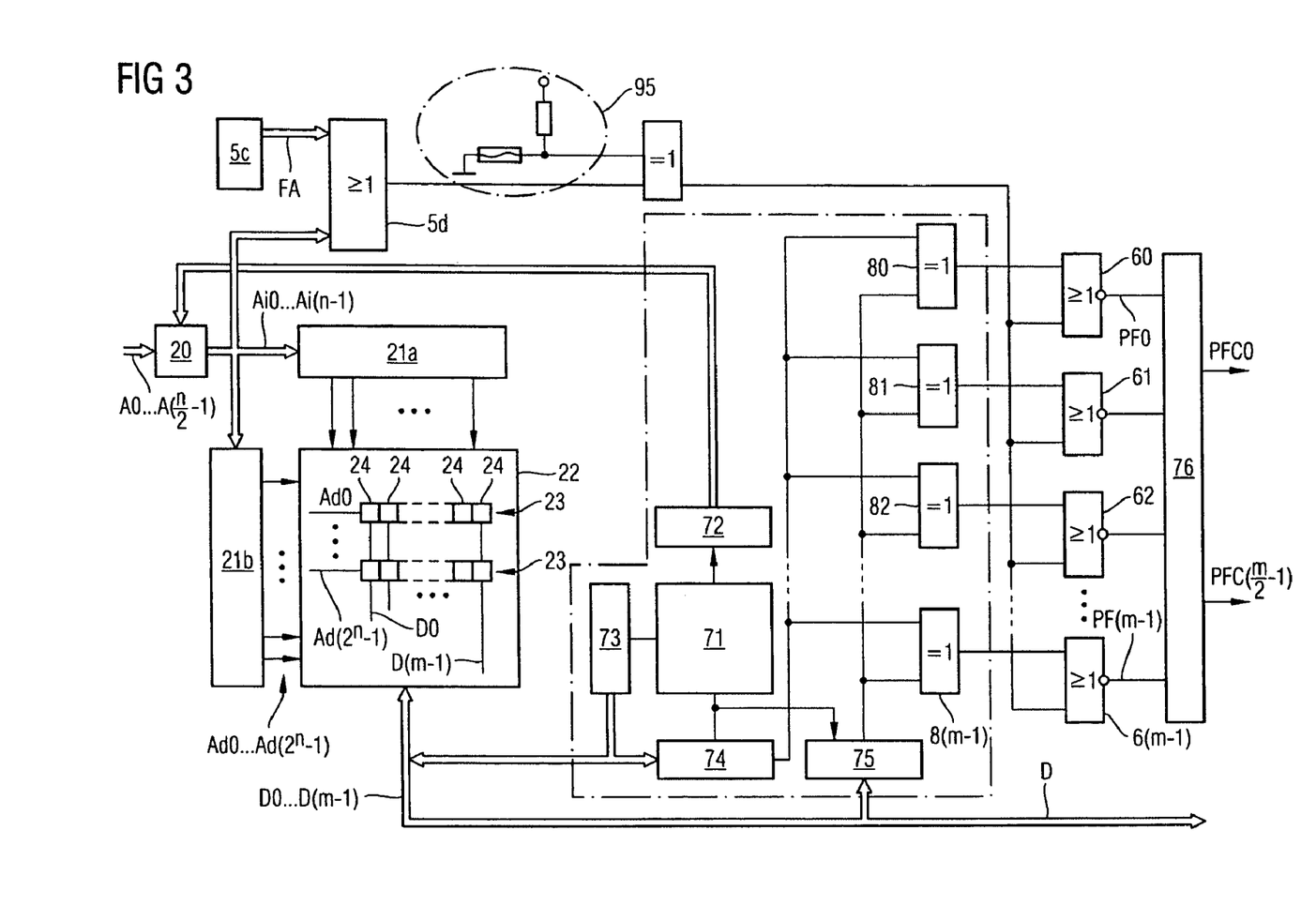
FIG. 3 illustrates a simplified block diagram of a detail from a semiconductor memory component with an internal test logic in accordance with a second exemplary embodiment of the invention.

The semiconductor memory component of FIG. 3 differs from that of FIG. 2 by virtue of the fact that a portion of the necessary circuit parts are partial structures of an internal test logic 7. The internal test logic 7 comprises a sequence controller 71, which controls an address counter 72 and a data generator 73 and also two registers 74, 75. For testing the memory cell array 22, test data words are generated in the data generator 73 and are successively written to the memory cell array 22, and read out again, with the aid of the test addresses output by the address counter 72. The respective test data word read into the memory cell array 22 is buffer-stored in the first register 74 corresponding to the test write register of the exemplary embodiment of FIG. 2. The data word read back from the memory cell array 22 is buffer-stored in the second register 75 corresponding to the test read register of the exemplary embodiment of FIG. 2. In contrast to the exemplary embodiment of FIG. 2, the test data words and also the test addresses are generated within the semiconductor memory component.

By means of a compression stage 76, the result of the evaluation is compressed and output on a smaller number of compression signal lines PFC0, PFC1, . . . .

The output signal of the address comparator 5d is activated by an activated classification memory element 95.

Figure 4:
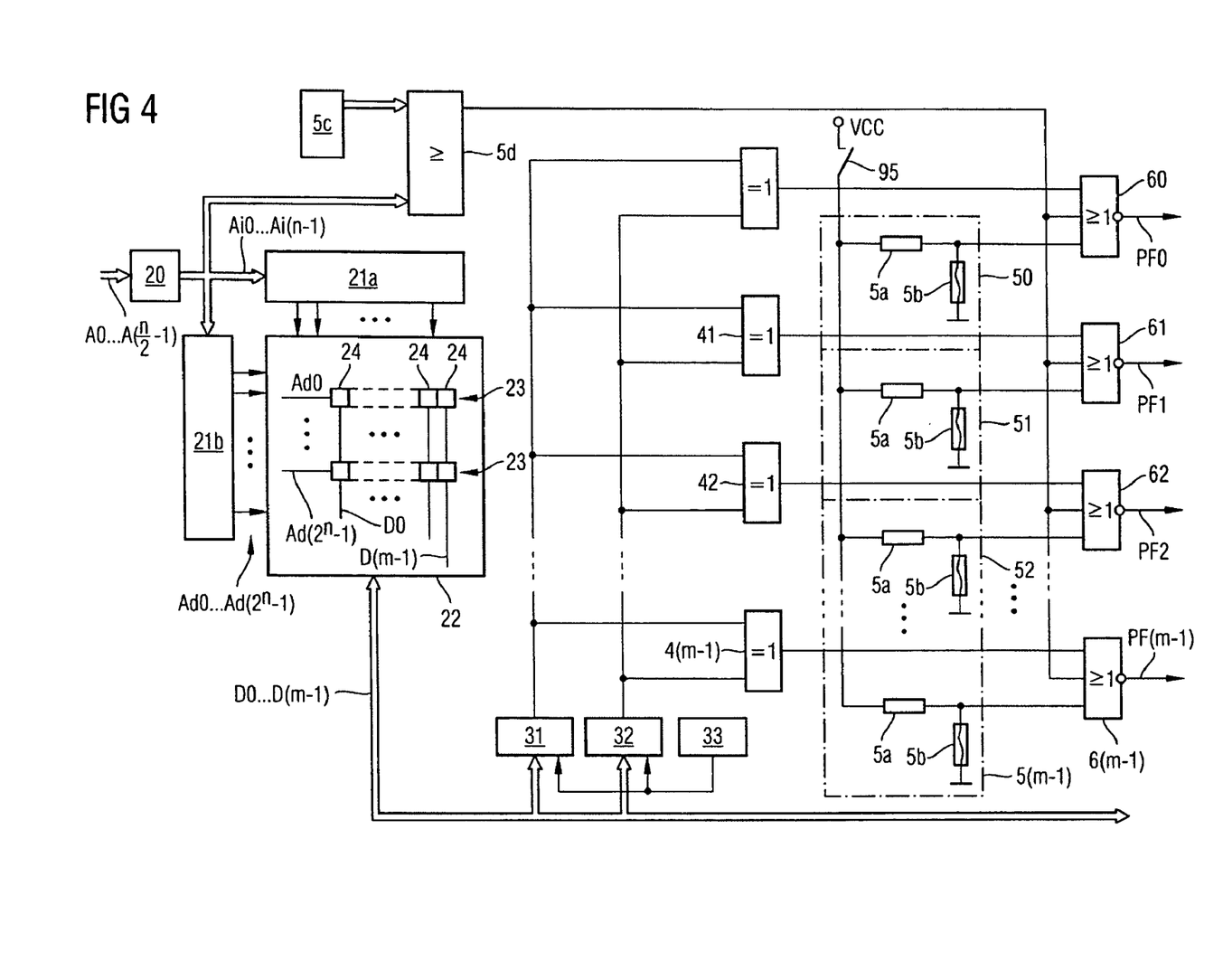
FIG. 4 illustrates a simplified block diagram of a detail from a semiconductor memory component with a reduced data word length in accordance with a third exemplary embodiment of the invention.

In the exemplary embodiment of FIG. 4, I/O skip units 50, 51, . . . composed of in each case a resistor 5a, which is put at a "high level" at one end, and a fuse 5b are supplemented, the outputs of said I/O skip units in each case being connected to a further input of the respectively assigned NOR gate 60, 61, . . . .

If the I/O skip units 50, 51, . . . are deactivated by an opened switch as part of the classification memory element 95, then only the address-related clamp mechanism described above is active. The PF signal lines PF0, PF1, . . . then transmit a "low level" corresponding to an error free signal in each case when the data word read back from the memory cell array 22 matches the data word buffer-stored in the test write register 32, and a "high level" corresponding to an error signal when there is no match, in which case, when the respective test address matches the error address FA, the error free signals are generated independently of the result of the comparison of the two data words.

In the case of an activated IO-related clamp mechanism, an error free signal is constrained on the respectively assigned PF signal lines in addition independently of the respective test address and independently of the result of the comparison of the two data words for the data lines masked out from the desired I/O area.

Figure 5:
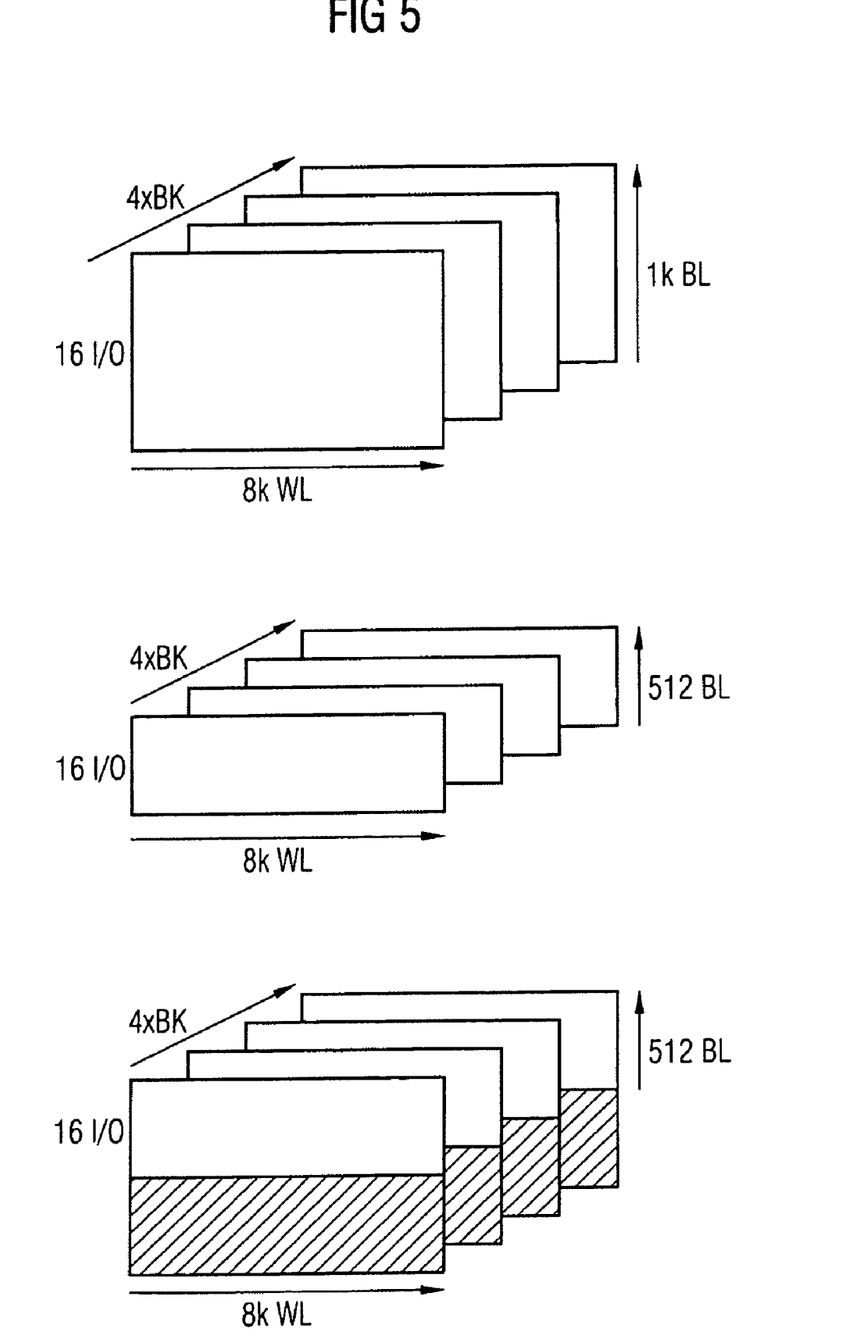
FIG. 5 illustrates a simplified diagram of the address space of a semiconductor memory component for elucidating the method according to the invention.

FIG. 5 relates to a 512 Mbit DRAM having a desired I/O area of 16 data bits D0 to D15 and a memory cell array organized into four memory banks BK. The data words comprising 16 memory cells in each case within each memory bank can be selected by means of 1 k bit lines BL and 8 k word lines WL.

The upper third of the figure illustrates the memory cell array of a semiconductor memory component that can be classified as all good memory.

The middle third of the figure illustrates the functional memory area of the memory cell array of a semiconductor memory component that is identical according to the internal construction but can only be classified as half good memory, which is to be tested by the external test apparatus, and during the testing of which possible errors in the lower half of the addressable memory area delay the test sequence, on the one hand, and are irrelevant, on the other.

The lower third of the figure illustrates the effect of the address-related clamp mechanism. The result of the memory test for the lower, hatched half of the memory is overwritten by an internally generated error free (pass) information item and appears to be error free from the standpoint of the external test apparatus.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory component comprising:
    a memory cell array, including data word groups having a desired number of memory cells storing data bits;
    a test write register for buffer-storing a primary test data word read into the memory cell array at a test address; and
    comparator units for comparing mutually corresponding data bits of the respective primary test data word and of a secondary test data word read out from the memory cell array from the test address, in which case, when mutually corresponding data bits in the primary and secondary test data words match, an error free signal is generated in each case on PF signal lines respectively assigned to one of the comparator units.

2. The semiconductor memory component of claim 1, further comprising an error address memory for storing an error address identifying a nonfunctional partial area of the desired address space, and an address comparator for comparing the respective test address with the error address, in which case, when the test address matches the error address, an error free signal is constrained in each case on the PF signal lines.

3. The semiconductor memory component as claimed in claim 1, having a test logic comprising:
    a data generator connected to the data lines and serving for generating the primary test data words;
    an address counter for generating the test addresses;
    a sequence controller, which controls the data generator and the address counter in a test mode of the semiconductor memory component; and
    an evaluation unit comprising the test write register and the comparator units.

4. The semiconductor memory component as claimed in claim 1, comprising a compression unit that combines an error information item transmitted on the signal lines on a number of compression signal lines that is less than the number of PF signal lines.

5. The semiconductor memory component of claim 1, comprising erasable I/O skip units respectively assigned to a data line, an I/O skip unit being erased if memory cells assigned to the respective data line are identified as not being functional, and an erased I/O skip unit constraining an error free signal on the corresponding PF signal line.

6. The semiconductor memory component of claim 1, comprising a classification memory element for storing a classification information item for distinguishing semiconductor memory components classified as all good memories, in the case of which the desired address space is functional, from semiconductor memory components classified as partial good memory, in the case of which a partial area of the desired address space is nonfunctional.

7. The semiconductor memory component as claimed in claim 6, comprising wherein the address comparator can be activated by the classification memory element.

8. The semiconductor memory component as claimed in claim 6, comprising wherein the classification memory element is suitable for storing a classification identifier, on the basis of which it is possible to distinguish between semiconductor memory components in the case of which the desired number of data lines is functional and semiconductor memory components in the case of which a portion of the data lines is nonfunctional.

9. The semiconductor memory component as claimed in claim 8, comprising wherein the I/O skip units can be activated by the classification memory element.

10. A semiconductor memory component comprising:
    a memory cell array, including data word groups having a desired number of memory cells;
    a plurality of data lines connected to a respective one of the memory cells of the data word groups suitable for transmitting data bits stored in the memory cells;
    a plurality of internal address lines configured for a desired address space in the memory cell array to be addressed by means of the internal address lines;
    a test write register for buffer-storing a primary test data word read into the memory cell array at a test address; and comparator units for comparing mutually corresponding data bits of the respective primary test data word and of a secondary test data word read out from the memory cell array from the test address, in which case, when mutually corresponding data bits in the primary and secondary test data words match, an error free signal is generated in each case on PF signal lines respectively assigned to one of the comparator units, further comprising an error address memory for storing an error address identifying a nonfunctional partial area of the desired address space, and an address comparator for comparing the respective test address with the error address, in which case, when the test address matches the error address, an error free signal is constrained in each case on the PF signal lines.

11. The semiconductor memory component as claimed in claim 10, having a test logic comprising:
a data generator connected to the data lines and serving for generating the primary test data words;
an address counter for generating the test addresses;
a sequence controller, which controls the data generator and the address counter in a test mode of the semiconductor memory component; and
an evaluation unit comprising the test write register and the comparator units.

12. The semiconductor memory component as claimed in claim 10, comprising:
a compression unit, that combines an error information item transmitted on the signal lines on a number of compression signal lines that is less than the number of PF signal lines.

13. The semiconductor memory component of claim 10, comprising erasable I/O skip units respectively assigned to a data line, an I/O skip unit being erased if memory cells assigned to the respective data line are identified as not being functional, and an erased I/O skip unit constraining an error free signal on the corresponding PF signal line.

14. The semiconductor memory component of claim 10, comprising a classification memory element for storing a classification information item for distinguishing semiconductor memory components classified as all good memories, in the case of which the desired address space is functional, from semiconductor memory components classified as partial good memory, in the case of which a partial area of the desired address space is nonfunctional.

15. The semiconductor memory component as claimed in claim 14, comprising wherein the address comparator can be activated by the classification memory element.

16. The semiconductor memory component as claimed in claim 14, comprising wherein the classification memory element is suitable for storing a classification identifier, on the basis of which it is possible to distinguish between semiconductor memory components in the case of which the desired number of data lines is functional and semiconductor memory components in the case of which a portion of the data lines is nonfunctional.

17. The semiconductor memory component as claimed in claim 16, comprising wherein the I/O skip units can be activated by the classification memory element.

18. A method for testing semiconductor wafers having semiconductor memory components each having a memory cell array, which in each case has a desired address space predefined by a desired number of addressing lines and a desired I/O area predefined by a desired number of data lines the memory cell arrays being functional to different extents, comprising:

functionally testing the memory cell arrays of the semiconductor memory components in a prefuse memory test;
replacing nonfunctional areas of the memory cell arrays by activating redundant memory cells;
storing an error address identifying an irreparable memory area within the desired address space in an error address memory in semiconductor memory components having a restricted memory area; and
functionally testing the semiconductor memory components in a postfuse memory test by writing in and reading out test data words at test addresses within the desired address space, an error-free behavior of the respective irreparable memory area being simulated in semiconductor memory components having a memory area with restricted functionality when the respective test address matches the error address.

19. The method as claimed in claim 18, comprising wherein during the postfuse memory test, generating the test data words and the test addresses in an internal test logic of the respective semiconductor memory device;
writing the test data words to the memory cell array and are buffer-stored in a test write register; and
reading out the test data words from the memory cell array and comprising bit by bit with the test data words buffer-stored in the test write register, an error free signal being generated on the corresponding signal lines when the compared data bits match, and an error signal being generated when there is no match.

20. The method as claimed in claim 18, comprising wherein marking a further irreparable memory area within the desired I/O area by erasing I/O skip units, assigned in each case to a data line assigned to the further irreparable memory area, in the semiconductor memory components having a restricted memory area, the erased I/O skip units, in the case of semiconductor memory components having a further irreparable memory area, simulating an error-free behavior of data lines assigned to the further nonfunctional memory area.

21. A semiconductor memory component comprising:
a memory cell array, including data word groups having a desired number of memory cells configured to store data bits;
means for buffer-storing a primary test data word read into the memory cell array at a test address; and
comparator means for comparing mutually corresponding data bits of the respective primary test data word and of a secondary test data word read out from the memory cell array from the test address, in which case, when mutually corresponding data bits in the primary and secondary test data words match, an error free signal is generated in each case on PF signal lines respectively assigned to one of the comparator means,
further comprising means for storing an error address identifying a nonfunctional partial area of the desired address space, and an address comparator for comparing the respective test address with the error address, in which case, when the test address matches the error address, an error free signal is constrained in each case on the signal lines.

* * * * *